(12) United States Patent
Janneck et al.

(10) Patent No.: US 7,761,272 B1
(45) Date of Patent: Jul. 20, 2010

(54) METHOD AND APPARATUS FOR PROCESSING A DATAFLOW DESCRIPTION OF A DIGITAL PROCESSING SYSTEM

(75) Inventors: Jorn W. Janneck, San Jose, CA (US); David B. Parlour, Fox Chapel, PA (US); Paul R. Schumacher, Berthoud, CO (US)

(73) Assignee: Xilinx, Inc., San Jose, CA (US)

( * ) Notice: Subject to any disclaimer, the term of this patent is extended or adjusted under 35 U.S.C. 154(b) by 608 days.

(21) Appl. No.: 11/373,745

(22) Filed: Mar. 10, 2006

(51) Int. Cl.
*G06F 17/50* (2006.01)
(52) U.S. Cl. .......................................... 703/13; 716/18
(58) Field of Classification Search ............. 703/13–17; 716/4–6, 18
See application file for complete search history.

(56) References Cited

U.S. PATENT DOCUMENTS

| | | | |
|---|---|---|---|
| 4,758,953 A | 7/1988 | Morita et al. | |
| 5,095,441 A | 3/1992 | Hopper et al. | |
| 5,247,651 A | 9/1993 | Clarisse | |
| 5,249,133 A | 9/1993 | Batra | |
| 5,452,239 A | 9/1995 | Dai et al. | |
| 5,553,272 A | 9/1996 | Ranganathan et al. | |
| 5,870,588 A | 2/1999 | Rompaey et al. | |
| 5,896,301 A | 4/1999 | Barrientos | |
| 5,898,595 A | 4/1999 | Bair et al. | |
| 5,910,899 A | 6/1999 | Barrientos | |
| 6,011,911 A | 1/2000 | Ho et al. | |
| 6,023,567 A | 2/2000 | Osler et al. | |
| 6,078,736 A | 6/2000 | Guccione | |
| 6,131,080 A | 10/2000 | Raimi et al. | |
| 6,135,647 A | 10/2000 | Balakrishnan et al. | |
| 6,154,719 A | 11/2000 | Saitoh et al. | |
| 6,216,258 B1 | 4/2001 | Mohan et al. | |
| 6,230,299 B1 | 5/2001 | McSherry et al. | |
| 6,237,007 B1 * | 5/2001 | Brown | 707/104.1 |
| 6,272,671 B1 | 8/2001 | Fakhry | |
| 6,530,071 B1 | 3/2003 | Guccione et al. | |
| 6,530,072 B1 | 3/2003 | Hagerman et al. | |
| 6,546,532 B1 | 4/2003 | Kerzman et al. | |
| 6,557,156 B1 | 4/2003 | Guccione | |
| 6,622,291 B1 | 9/2003 | Ginetti | |
| 6,678,646 B1 | 1/2004 | McConnell et al. | |
| 6,725,441 B1 | 4/2004 | Keller et al. | |

(Continued)

OTHER PUBLICATIONS

Juri Tolujev, Peter Lorenz, Daniel Beier, Thomas J. Schriber, "Assessment of Simulation Models Based on Trace-File Analysis: A Metamodeling Approach" Proceedings of the 1998 Winter Simulation Conference, pp. 443-450.*

(Continued)

*Primary Examiner*—Dwin M Craig
(74) *Attorney, Agent, or Firm*—Robert M. Brush; LeRoy D. Maunu; Lois D. Cartier

(57) ABSTRACT

Method and apparatus for processing a dataflow description of a digital processing system is described. In one example, a model of the dataflow description is simulated. Computational steps performed during the simulation and actual dependencies among the computational steps resulting from the simulation are identified. Causation trace data is generated in response to the step of recording. The causation trace data may then be analyzed using one or more analyses to produce quantitative data that characterizes the dataflow description.

13 Claims, 4 Drawing Sheets

U.S. PATENT DOCUMENTS

| | | |
|---|---|---|
| 6,756,922 B2 | 6/2004 | Ossia |
| 6,829,753 B2 | 12/2004 | Lee et al. |
| 6,865,726 B1 | 3/2005 | Igusa et al. |
| 6,868,017 B2 | 3/2005 | Ikeda |
| 6,868,532 B2 | 3/2005 | Nadeau-Dostie et al. |
| 6,922,665 B1 | 7/2005 | Guccione et al. |
| 6,988,238 B1 | 1/2006 | Kovacevic et al. |
| 6,993,733 B2 | 1/2006 | Murphy |
| 7,003,751 B1 | 2/2006 | Stroomer et al. |
| 7,006,960 B2 | 2/2006 | Schaumont et al. |
| 7,024,654 B2 | 4/2006 | Bersch et al. |
| 7,062,418 B2 | 6/2006 | Lee et al. |
| 7,073,152 B2 | 7/2006 | Keller et al. |
| 7,073,158 B2 | 7/2006 | McCubbrey |
| 7,139,955 B2 | 11/2006 | Rohrbaugh et al. |
| 7,143,367 B2 | 11/2006 | Eng |
| 7,146,300 B2 | 12/2006 | Zammit et al. |
| 7,146,583 B1 | 12/2006 | Sun et al. |
| 7,194,714 B2 | 3/2007 | Kartschoke et al. |
| 7,203,632 B2 | 4/2007 | Milne et al. |
| 7,216,321 B2 | 5/2007 | Murphy et al. |
| 7,222,315 B2 | 5/2007 | Schubert et al. |
| 7,240,303 B1 | 7/2007 | Schubert et al. |
| 7,243,330 B1 | 7/2007 | Ganesan et al. |
| 7,260,794 B2 | 8/2007 | Butts |
| 7,337,422 B1 | 2/2008 | Becker et al. |
| 7,437,692 B2 | 10/2008 | Oberlaender |
| 7,464,360 B2 | 12/2008 | Haji-Aghajani et al. |
| 7,469,400 B2 | 12/2008 | Roesner et al. |
| 7,480,606 B2 | 1/2009 | Tseng et al. |
| 2001/0007139 A1 | 7/2001 | Murray |
| 2002/0049958 A1 | 4/2002 | Shimazawa |
| 2002/0059054 A1 | 5/2002 | Bade et al. |
| 2003/0084416 A1 | 5/2003 | Dai et al. |
| 2003/0216901 A1* | 11/2003 | Schaumont et al. ............ 703/13 |
| 2004/0015613 A1 | 1/2004 | Ikeda |
| 2004/0141354 A1 | 7/2004 | Carnahan |
| 2005/0063481 A1 | 3/2005 | Fechtel et al. |
| 2005/0188339 A1 | 8/2005 | Anderson |
| 2005/0210383 A1 | 9/2005 | Cucerzan et al. |
| 2005/0268258 A1 | 12/2005 | Decker |
| 2005/0268260 A1 | 12/2005 | Colley |
| 2006/0059134 A1 | 3/2006 | Palmon et al. |
| 2006/0090146 A1 | 4/2006 | LeBritton et al. |
| 2006/0136193 A1 | 6/2006 | Lux-Pogodalla et al. |
| 2006/0200788 A1 | 9/2006 | Nation et al. |

OTHER PUBLICATIONS

Om P. Damani, Yi-Min Wang, Vijay K. Garg, "Optimistic Distributed Simulation Based on Transitive Dependency" IEEE 1997 pp. 90-97.*

Hsu, Chia-Jul et al.; "DIF: An Interchange Format for Dataflow-based Design Tools"; International Workshop on Systems, Architectures, Modeling and Simulation; Jul. 2004; available from Department of Electrical and Computer Engineering and Institute for Advanced Computer Studies, University of Maryland, College Park, 20742; pp. 1-10.

Lee, Edward A. et al.; "Dataflow Process Networks"; May 1995; IEEE, vol. 83, No. 5; available from IEEE, 3 Park Avenue, 17th Floor, New York, NY 10016-5997; pp. 773-799.

Shikhar, Bhattacharyya Shuvra; "Compiling Dataflow Programs for Digital Signal Processing"; Jul. 1994; available from Department of Electrical Engineering and Computer Sciences, University of California at Berkeley, Berkeley, CA 94720; pp. 1-250.

Tanaka et al.; "High Speed String Edit Methods Using Hierarchical Files and Hashing Technique"; Nov. 14-17, 1988 Pattern Recognition; 9th International Conference; vol. 1; Copyright 1988 IEEE; pp. 334-336.

Navarro, Gonzalo; "Pattern Matching," Department of Computer Science University of Chile, pp. 1-24, Mar. 7, 2005, available from the Internet at http://www.ciw.cl/publicaciones/jstat04.pdf.

Xilinx, Inc.; U.S. Appl. No. 11/083,667 by Milne et al. filed Mar. 18, 2005.

J. Eker and J.W. Janneck; "CAL Language Report—Specification of the CAL actor Language"; Version 1.0, document edition 1; ERL Technical Memo UCB/ERL, M03/48; University of California at Berkeley; Dec. 1, 2003; pp. 1-112.

Massimo Ravasi et al.; "High-Level Algorithmic Complexity Evaluation for System Design"; Journal of Systems Architecture; Feb. 2003; Copyright 2003 Elsevier Science B.V.; available at www.ComputerScienceWeb.com; pp. 403-427.

Xilinx, Inc.; "Two Flows for Partial Reconfiguration: Module Based or Difference Based"; XAPP290 (v1.2); Sep. 9, 2004; available from www.xilinx.com; pp. 1-28.

Xilinx, Inc.; U.S. Appl. No. 11/373,744 by Janneck et al. filed Mar. 10, 2006.

Xilinx, Inc.; U.S. Appl. No. 11/373,709 by Schumacher et al. filed Mar. 10, 2006.

Xilinx, Inc.; U.S. Appl. No. 11/243,679 by Janneck et al. filed Oct. 4, 2005.

Xilinx, Inc.; U.S. Appl. No. 11/243,732 by Vogenthaler filed Oct. 4, 2005.

* cited by examiner

METHOD AND APPARATUS FOR PROCESSING A DATAFLOW DESCRIPTION OF A DIGITAL PROCESSING SYSTEM

FIELD OF THE INVENTION

One or more aspects of the present invention relate generally to electronic circuit design and analysis systems and, more particularly, to a method and apparatus for processing a dataflow description of a digital processing system.

BACKGROUND OF THE INVENTION

Modern integrated circuits are designed using programmed computers. Such computers are conventionally programmed with Electronic Design Automation (EDA) and Electronic Computer-Aided Design (ECAD) tools (generally referred to as EDA tools). EDA tools process an abstract representation of a circuit design into a physical representation of the circuit design that can be implemented using integrated circuitry. For example, a circuit design may be specified by a designer using a hardware description language (HDL), such as the very high speed integrated circuit hardware description language (VHDL) or VERILOG. Notably, a model of the circuit design is typically simulated prior to physical implementation in order to ascertain the functional correctness of the design and/or obtain various performance estimates. EDA simulators typically produce quantitative data that characterizes the circuit design.

Conventional EDA systems cannot map ordinary sequential programs into efficient concurrent circuit implementations. Sequential programming languages, such as C, obscure the concurrency available in an algorithm and encourage the specification of systems that assume all data resides in one globally accessible memory. As such, this form of specification is not suited for concurrent circuit implementations. Present EDA simulators are configured to process sequential descriptions of an algorithm or system. Thus, such EDA simulators disregard metrics that quantify the amount of potential parallelism in a concurrent circuit implementation. Accordingly, there exists a need in the art for a method and apparatus for obtaining quantitative data characterizing a concurrent circuit design.

SUMMARY OF THE INVENTION

Method and apparatus for processing a dataflow description of a digital processing system is described. In one embodiment, a model of the dataflow description is simulated. Computational steps performed during the simulation and actual dependencies among the computational steps resulting from the simulation are identified. Causation trace data is generated in response to the step of recording. The causation trace data may then be analyzed using one or more analyses to produce quantitative data that characterizes the dataflow description.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for processing a dataflow description of a digital processing system is described. The digital processing system comprises hardware, software, or a combination of hardware and software. The dataflow description is configured to be processed to generate a physical implementation of the system. The hardware portion of the system may be implemented using an integrated circuit (IC), such as a programmable logic device (PLD) (e.g., a field programmable gate array (FPGA)), an application specific integrated circuit (ASIC), and the like.

One aspect of the invention relates to extracting a causation trace from simulation of a model of the dataflow description. The causation trace describes actual dependencies between computational steps performed during execution of the simulation in response to a particular input stimulus. The causation trace may be used to profile and analyze the dataflow description.

Figure 1:
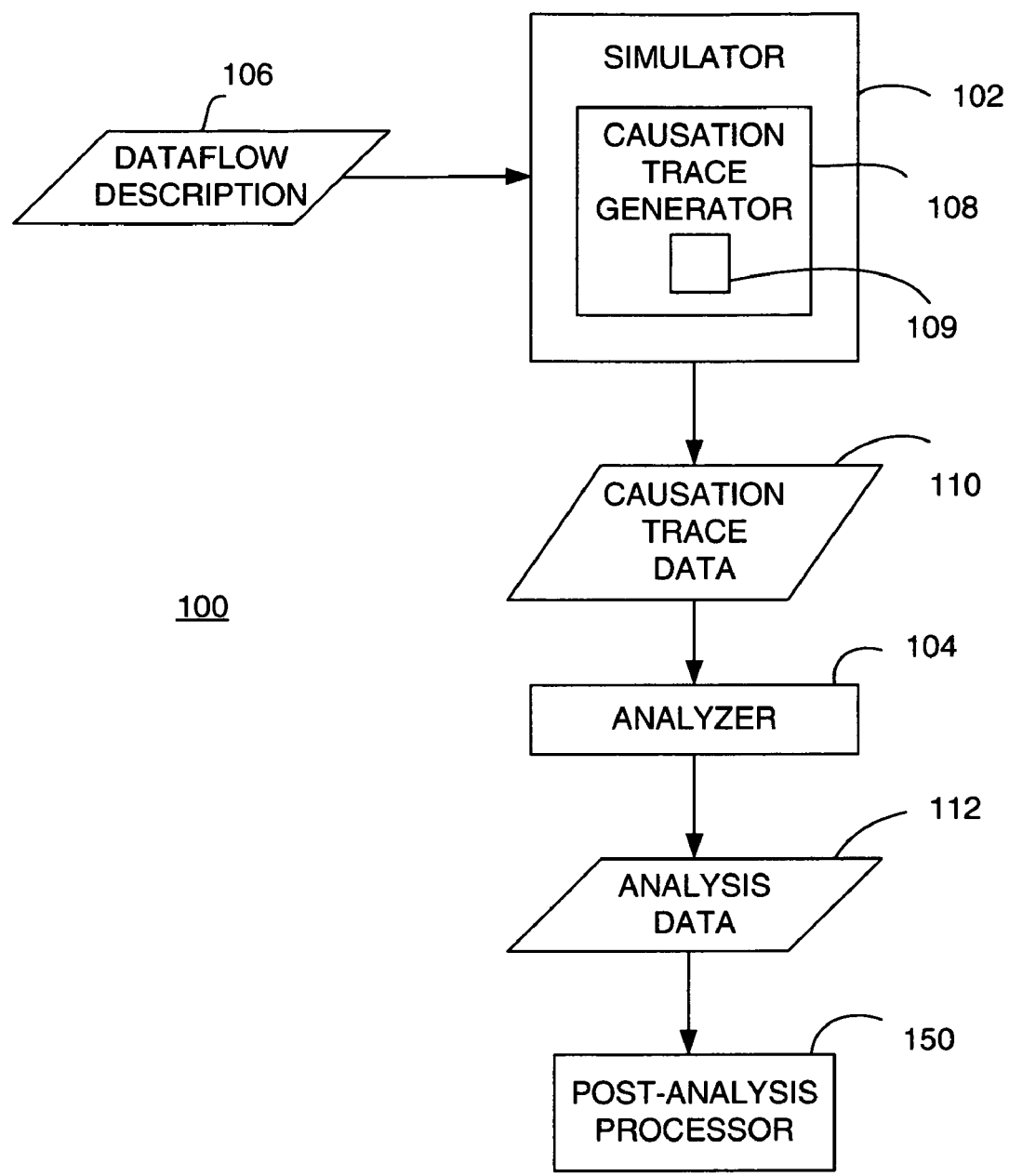
FIG. 1 is a block diagram depicting an exemplary embodiment of a system for analyzing a description of a dataflow network in accordance with one or more aspects of the invention.

FIG. 1 is a block diagram depicting an exemplary embodiment of a system 100 for analyzing a description of a dataflow network in accordance with one or more aspects of the invention. The system 100 includes a simulator 102 and an analyzer 104. The simulator 102 is configured to receive a dataflow description 106. The dataflow description 106 comprises a description of a concurrent digital processing system in an abstract, implementation independent form. The simulator 102 is configured to simulate a model of the system specified by the dataflow description 106. As is well known in the art, a model of the dataflow description 106 may be simulated prior to physical implementation in order to ascertain the functional correctness of the design, as well as obtain performance estimates for the design. As is well known in the art, the system may be physically implemented using an integrated circuit, such as programmable logic device (PLD) (e.g., field programmable gate array (FPGA)) or an application specific integrated circuit (ASIC).

In accordance with an embodiment of the invention, the simulator 102 includes a causation trace generator 108. The causation trace generator 108 is configured to generate at least one causation trace in response to simulation of the dataflow description 106. A "causation trace" of a system is the result of recording, during the simulation, the computational steps that were performed, as well as the actual dependencies among the steps, in response to particular input data. A step is dependent on another step if the latter (or some part of it) has to be completed, and its results made available, for the former to execute. The causation trace generator 108 produces causation trace data 110 as output. The causation trace data 110 may include one or more causation traces. For example, the causation trace generator 108 may produce a causation trace for each run of the simulation 102 using various sets of input data. A causation trace effectively provides hindsight into how the various steps of that run through the simulator 102 ended up being related to one another. By contrast, static analyses, as well as runtime decisions, are made at points in time when much of that dependency structure is still unknown. The analyzer 104 is configured to receive the causation trace data 110. The analyzer 104 is configured perform one or more analyses using the causation trace data 110 to produce analysis data 112. Exemplary analyses are described below.

In one embodiment, the dataflow description 106 is specified using a concurrent programming language. A concurrent programming language is a language that reflects a concurrent programming model, rather than a conventional sequential programming model. The dataflow description 106 includes programming constructs that define a network of processes interconnected by communication channels, providing an implementation-independent software model of a concurrent system. Each process is described by the inputs and outputs it has, the actions it can perform, the rules for triggering the actions ("firings"), and the persistent state between firings. The process description does not imply an implementation technology (e.g., processor software, ASIC hardware, FPGA hardware).

In one embodiment, the dataflow description 106 is specified using an actor language known as the CAL programming language. For purposes of clarity by example, an embodiment of the invention is described below with specific reference to the CAL programming language. A description is given in the "CAL language Report", by Eker and Janneck, ERL technical Memo UCB/ERL M03/48, University of California at Berkeley, Dec. 1, 2003, which is herein incorporated by reference. Those skilled in the art will appreciate that the invention may be used with other languages that reflect concurrent programming models, such as SystemC. The dataflow description 106 includes units referred to as actors, which model the processes of a concurrent system. Actors communicate through ports and are opaque (i.e., their internal state is not visible outside the actor). The ports are unidirectional (input or output) and they communicate tokens, which are discrete units of data. Actors consume or produce discrete tokens as a result of action firings. The connections between actors, which model the communication channels of the concurrent system, represent a higher level of abstraction than simple wires. Channels can have memory, and it is possible for an actor to check the availability and value of tokens at its input ports.

Figure 2:
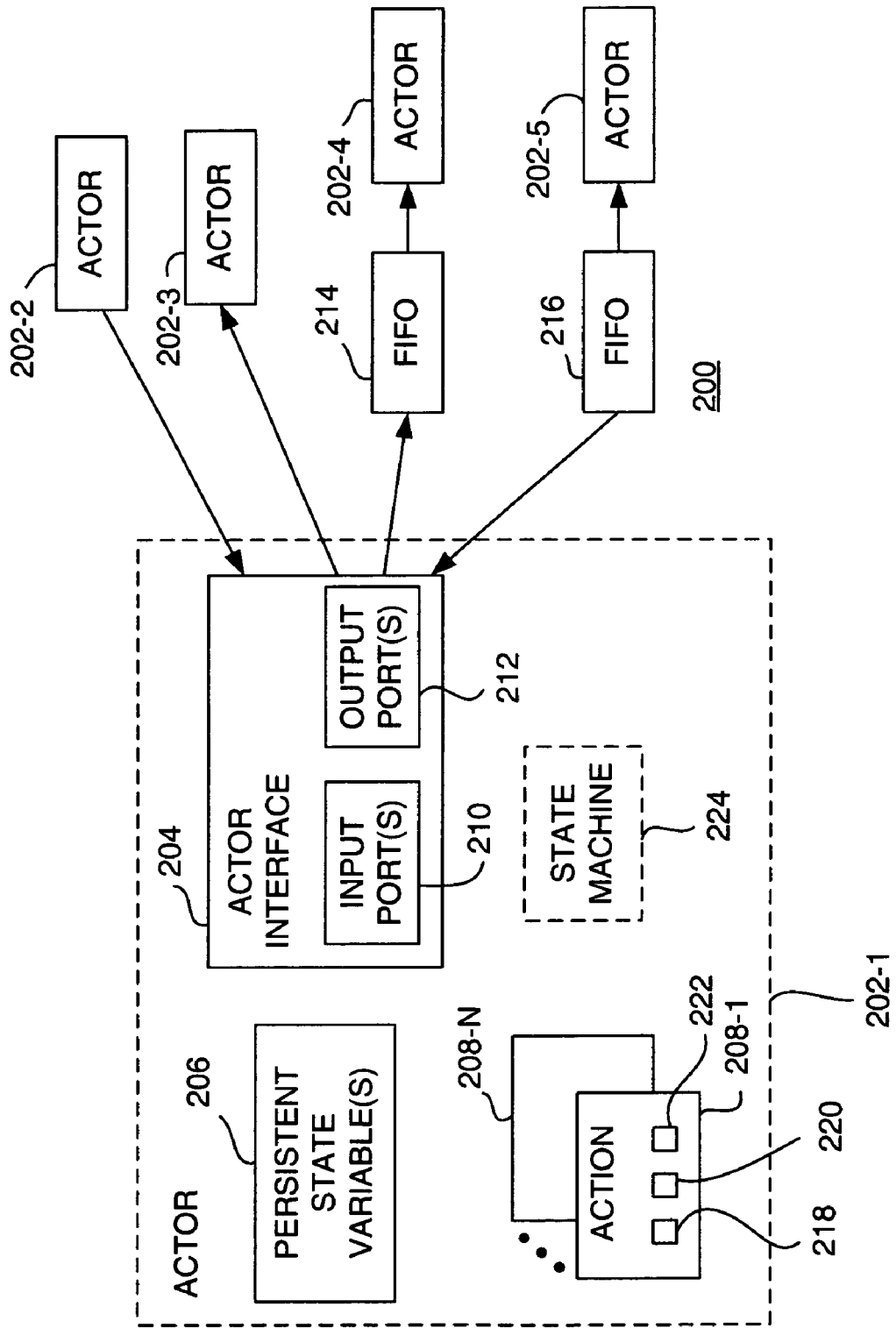
FIG. 2 is a block diagram depicting an exemplary embodiment of a dataflow description defined in accordance with one or more aspects of the invention.

In particular, FIG. 2 is a block diagram depicting an exemplary embodiment of a program 200 defined in accordance with one or more aspects of the invention. Another embodiment is disclosed in commonly assigned, co-pending U.S. patent application Ser. No. 11/243,679, entitled "Method and Apparatus for Implementing a Program Language Description of a Circuit Design for an Integrated Circuit", by Jorn W. Janneck, et. al., filed Oct. 4, 2005, which is herein incorporated by reference. The program 200 illustratively includes actors 202-1 through 202-5. For clarity, only the actor 202-1 is shown in detail. It is to be understood that the actors 202-2 through 202-5 are similar to the actor 202-1. The actor 202-1 includes an actor interface 204, persistent variables 206, and actions 208-1 through 208-N (collectively referred to as actions 208), where N is an integer greater than zero. The actor interlace 204 may include one or more input ports 210 and one or more output ports 212. In some cases, the actor interface 204 may include only the output ports 212. In some other cases, the actor interface 204 may include only the input ports 210. In the present example, the actor interface 204 may receive tokens directly from the actor 202-2 and provides tokens directly to the actor 202-3. The actor interface 204 provides tokens to the actor 202-4 through a first-in-first-out memory (FIFO) model 214, and receives tokens from the actor 202-5 through a FIFO model 216. In terms of physical implementation, the circuit that implements the actor 202-1 communicates with the circuits that implement the actors 202-2 and 202-3 synchronously and the circuits that implement the actors 202-4 and 202-5 asynchronously. The program 200 need not specify the storage mechanism of the communication channels. The programmer can assume that the channel depth is infinite. Automatic or manual analysis of the actor network may be used to determine the required channel depths for correct program operation.

The persistent variables 206 store the state of the actor 202-1. The values of the persistent variables 206 are readable and writeable by any of the actions 208. Notably, the persistent variables 206 have actor-scope in that they are accessible only from within the actor 202-1. In terms of actual physical implementation, the persistent variables 206 may be registers or multi-port memories with associated controls and multiplexing logic.

Each of the actions 208 is configured to read some number of tokens from various ones of the input ports 210 and write some number of tokens to various ones of the output ports 212. Alternatively, an action may be configured to just read tokens from input ports and produce no output tokens, or an action may be configured to just write tokens to output ports and receive no input tokens. In any case, each of the actions 208 includes firing rule data 218 that dictates when the action may "fire" (i.e., execute its described operation). In one embodiment, an action only fires if the necessary input tokens are present at the input ports 210 ("default firing rule"). Alternatively, or in addition to the default firing rule, an action may fire based on one or more guard conditions that must be true for the action to fire. Guard conditions may be Boolean expressions that test any persistent state variable of the actor or input token.

Each of the actions 208 may also include one or more local variables 220. The value of the local variables 220 do not persist from firing to firing, but may be used to hold temporary or intermediate results during execution of a particular firing. Each of the actions 208 may include procedural instruction data 222. The procedural instruction data 222 includes a sequence of instructions that is executed during a firing. Notably, the simplest action merely copies from an input to an output and thus has no procedural instruction data 222. The procedural instruction data 222 may include various constructs, such as assignments, flow control (e.g., if/else, loops), and the like.

Notably, each firing of an action is atomic. That is, no other action may read or write to any resource that is written to or read by an action whose firing is already underway (including the use of resources in guard conditions). Provided that the rule of atomicity is observed, multiple actions are permitted to execute concurrently. In this manner, the program 200 employs a concurrent programming model.

An action may implement state-machine like behavior using the procedural instruction data 222 by modifying persistent variables of the actor 202-1 and testing them in guard conditions. In one embodiment, the actor 202-1 may include a state machine declaration 224. The state machine declaration 224 declares a state machine in finite state machine (FSM) form by an initial state and any number of state transitions that accompany the firing of one or more of the actions 208. The source states for the transitions become additional requirements for the action firings that are logically ANDed with the other firing rules, described above.

Returning to FIG. 1, in the present example, a computational step identified by the causation trace generator 108 is the firing of an action. The firing of an action may depend on the firing of another action through various dependencies.

One type of dependency is a "state dependency". If both actions are part of the same actor, they may depend on each other by using the same state elements (e.g., the same variable). There are two kinds of state dependency: write/read (WR) and read/write (RW) dependencies. A WR dependency exists between two steps if the earlier one writes to a variable and the later one reads that value without intervening write operations. A RW dependency exists between two actions if the earlier one reads a variable and the later one writes to the variable.

Another type of dependency is a "scheduler dependency". This dependency may be considered a special case of the WR state dependency, as it connects to actions (of the same actor) that are related via the scheduler state machine of the actor. If executing an action causes the actor to make a state transition in its scheduler state machine, then this action, and the action whose execution made the actor go into the state at the beginning of the transition, are linked by a scheduler dependency.

Another type of dependency is a "port dependency". If both actions are part of the same actor, they may use the same input/output ports to receive or send tokens, in which case they need to access those ports in the order in which they were fired in the simulator 102. If two actions are only port dependent, their computations can be performed entirely in parallel, as long as the tokens enter and exit the actions in the proper order.

Another type of dependency is a "token dependency". Two actions may depend on each other because one of them is producing a token that is consumed by the other. In this case, those actions may be in different actors, or they may be part of the same actor (in case of a direct dataflow feedback loop).

In the present example, a causation trace produced by the causation trace generator 108 is a record of the actual dependencies of actions in a particular run in the simulator 102, acting on a particular set of inputs. In one embodiment, the causation trace generator 108 maintains a table of information during the simulation of the dataflow description 106, which is used to generate the dependencies ("dependency information table 109"). The types of data recorded depend on the types of dependencies to be determined. For example, for each actor state variable, the last action firing in which the actor state variable was modified is recorded. This can be used to determine state dependency between two computational steps. For each port, the last action firing that either read or wrote to the port is recorded. This can be used to determine port dependency between two computational steps. For each token inside an input queue, the action firing in which the token arrived at that queue is recorded. This can be used to determine token dependency between two computational steps. If an actor has a scheduler state machine, the last labeled action (i.e., an action associated with states of the state machine) that was executed for this actor is recorded. This can be used to determine scheduler dependency between two computational steps.

Dependencies may be generated according to the following rules. If a state variable is read in a step, then this implies a dependency from the last step in which that variable was modified to the current step. If a token crosses a port, either by being read from or by being written to it, this implies: (1) a port dependency from the last step in which a token crossed that port to the current step; and (2) in case of a token being read, a token dependency from the step in which the token arrived at the queue to the current step. If the actor has a scheduler state machine and the action executed in this step is labeled, this implies a scheduler dependency between the last step in which a labeled action of this actor was executed and the current step.

A causation trace is a directed acyclic graph (DAG) that represents the actual dependencies of discrete computation steps (e.g., action firings) in the execution of a system upon each other. In one embodiment, the causation trace data 110 comprises a stream of text in extensible markup language (XML) format that represents the causation trace for all actors in the simulation. The top-level element in an XML file generated by the trace generator 108 is a causation-trace element and it includes any number of step elements, which in turn include any number of dependency elements. For example, a step element may be defined as follows:

<step kind="immediate" ID=" . . . " actor-name=" . . . " actor-id=" . . . " action=" . . . " current-time=" . . . ">

The kind attribute has a value of immediate, which indicates the firing of an action. The ID attribute indicates a unique identifier used to refer to this step in the dependencies. The actor-name attribute indicates the name of the actor class. The actor-id attribute indicates a unique identifier used to refer to the actor instance. The action attribute indicates the action number corresponding to the lexical position of the action in the source, starting from zero. The current-time attribute indicates the simulation time when the action was executed.

One type of dependency element may be defined as follows:

<dependency kind="token" source=" . . . " port=" . . . " ntokens=" . . . ">

The kind attribute has a value of token, which represents a token dependency between the step element having the dependency element and the step identified by the source attribute. The source attribute indicates the ID of the step that the current step depends on. The port attribute indicates the name of the port the tokens were read from. The ntokens attribute indicates the number of tokens read.

Another type of dependency element may be defined as follows:

<dependency kind="port" source=" . . . " port=" . . . " port-type=" . . . " ntokens=" . . . ">

The kind attribute has a value of port, which represents a port dependency between the step element having the dependency element and the step identified by the source attribute. The source attribute indicates the ID of the step that the current step depends on. The port attribute indicates the name of the port that gave rise to this dependency. The port-type attribute indicates the kind of port (e.g., input or output). The ntokens attribute indicates the number of tokens that crossed that port in this step.

Another type of dependency element may be defined as follows:

<dependency kind="stateVar" source=" . . . " var=" . . . " dir=" . . . ">

The kind attribute has a value of stateVar, which represents a state dependency between the step element having the dependency element and the step identified by the source attribute. The source attribute indices the ID of the step that the current step depends on. The var attribute indicates the name of the variable that gave rise to the dependency. The dir attribute indicates the direction of the dependency (e.g., from writer to reader (WR) or from reader to writer (RW)).

Another type of dependency element may be defined as follows:

<dependency kind="scheduler" source=" . . . ">

The kind attribute has a value of scheduler, which represents a scheduler dependency between the step element having the dependency element and the step identified by the source attribute. The source attribute indicates the ID of the step that the current step depends on.

Figure 3:
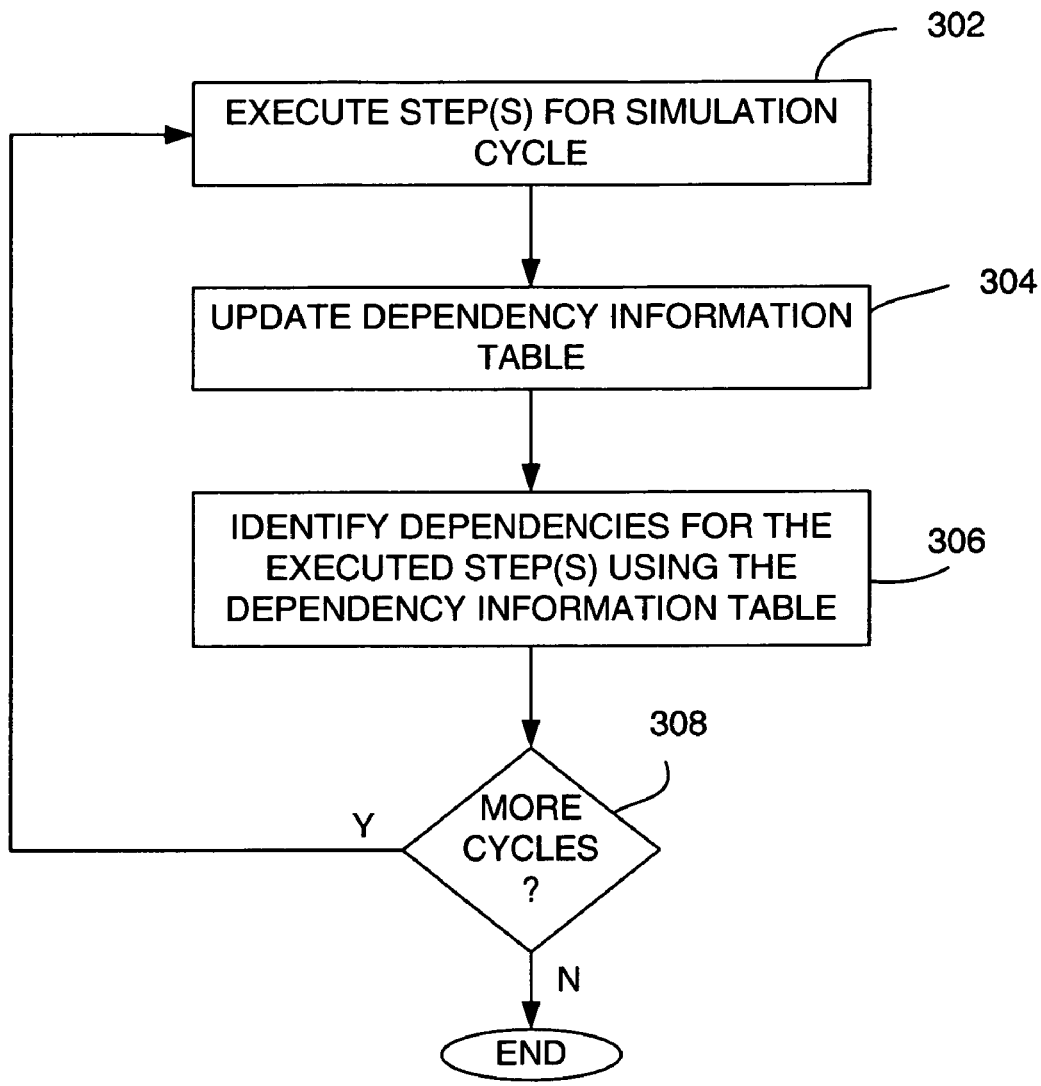
FIG. 3 is a flow diagram depicting an exemplary embodiment of a method for generating a causation trace for a dataflow description of a digital processing system.

FIG. 3 is a flow diagram depicting an exemplary embodiment of a method 300 for generating a causation trace for a dataflow description of a digital processing system. The method 300 is performed during simulation of a model of the dataflow description with particular input stimulus. In the present example, the simulation includes a sequence of discrete simulation cycles where, for each simulation cycle, one or more computational steps (e.g., action firings) are performed. The method 300 begins at step 302, where one or more steps are executed for a simulation cycle. For example, one or more actions may be fired as dictated by the dataflow description and/or particular input stimulus. At step 304, a dependency information table is updated. For example, if a given state variable is modified, the step that modified the state variable is recorded in the table. If a port is written to or read from, the step that did the reading or writing is recorded. At step 306, dependencies are identified for the step(s) executed at step 302 using the dependency information table. At step 308, a determination is made whether there are more simulation cycles. If so, the method 300 returns to step 302 and repeats. Otherwise, the method 300 ends at step 310.

Returning to FIG. 1, in one embodiment, the analyzer 104 performs one or more of three fundamental analyses: statistical analysis, structural analysis, and postmortem scheduling. In statistical analysis, information is gathered by counting the occurrence of various elements or constellations in a causation trace and computing derivative numbers from these counts. For example, a causation trace may be analyzed to count the number of firings of an actor instance, count the number of firings of an actor class, count the number of firings of an action in an instance, count the number of firings of an action for all instances of the class, and/or count the number of tokens communicated across a connection. In an actor with a branching state machine, the causation trace may be analyzed to compute the relative frequency of the branches taken. It is to be understood that various other types of statistics may be computed from a causation trace.

In structural analysis, the structure of a causation trace is identified. For example, the "widest" cut through the DAG of a causation trace may be determined. A "cut" is a separation of the nodes of the DAG into two sets such that the arcs that connect the nodes in one set with the nodes in the other set all go in the same direction (i.e., the arcs all start in the same set and end in the same set). The widest cut through the DAG corresponds to the largest number of concurrent activities. This could be qualified, such as the cut containing the largest number of actions of a specific kind or of a specific actor. In another example, the longest path inside the DAG of a causation trace may be determined. The longest path corresponds to the minimal number of steps (action firings) that are needed to perform the computation in question. In another example, if each step is weighted, the path with the highest cumulative weight can be extracted, which provides a measure for the minimal latency of the causation trace. Each step may be weighted, for example, by a number denoting the time required to perform the computation of that step. Those skilled in the art will appreciate that other types of structures in a causation trace may be identified.

In postmortem scheduling analysis, a schedule for a causation trace is computed. Such a schedule assigns to each computational step in the trace a start time, possibly assigns an end time, and allocates specific hardware resources to it for the duration of its execution. The analysis is "postmortem" in a sense that the scheduling happens on a causation trace that was derived from a specific execution of a model during simulation, and it is performed after the execution of the model. The analyzer 104 may use any number of criteria for producing a schedule. For example, the analyzer 104 may produce an ASAP (as soon as possible) schedule, in which every step is scheduled as soon as all steps that it depends on have been completed. An ASAP schedule provides an estimate of the shortest possible latency, and also can be used to give a bound for the resources that can be usefully employed to execute a causation trace.

In another example, the analyzer 104 may constrain the possible schedules by bounding the resources that may be used at any point in time. The analyzer 104 assumes a predefined number of resources of each type, and by scheduling steps only when the required resources of the respective types are available. There are a number of variants of this type of resource-constrained scheduling. First, the analyzer 104 may maintain only resource pools for each type of resource, and does not distinguish between resource instances of a given type. In other words, the analyzer 104 assumes resources to be completely fungible, which means they can by shared without penalty. This simplifying assumption makes it possible to determine an upper bound for the efficiency of a causation trace under some resource constraint, without recourse to a specific mapping/allocation strategy.

In another variant, the analyzer 104 assumes a specific mapping of computational entities (and consequently steps, which record the actors and actions they are executing) to resources. Such a mapping allows the quantification of resource sharing overhead, as it makes the sharing of resources explicit. A schedule of this kind is always subject to a specific mapping policy (i.e., it measures the efficiency of the mapping as much as it measures the efficiency of the algorithm of the hardware platform).

In yet another variant, an intermediate family of scheduling algorithms generates the mapping during execution, based on some heuristics. Whenever an operation needs to execute, it is assigned resources, and the heuristics decide which operation is selected next (e.g., it may use the overall frequency of the operation compared to other operations using the same resources).

In any case, in contrast to scheduling that happens statically or even dynamically at runtime, postmortem scheduling of a causation trace with dependency relations has much more information at its disposal. For example, it can determine for each step to be scheduled the number of follow-up steps that become enabled by its execution. It can therefore compute schedules that might be very difficult to obtain for static or runtime scheduling methods.

In one embodiment, the analysis data 112 are used by a post-analysis processor 150. The post-analysis processor 150 may use the analysis data 112 to generate data for controlling an actual physical implementation of the dataflow description 106 for a target PLD. For example, the post-analysis processor 150 may derive a set of compilation constraints for generating an actual implementation. Execution units in the dataflow description (e.g., actions) that are executed frequently are given implementation directives to achieve higher throughput at the expense of silicon area, whereas infrequently executed actions are constrained to use less area at a lower performance point. The compilation constraints can be used by implementation tools (not shown) for the PLD to generate an optimal physical implementation.

In another example, the post-analysis processor 150 may use the analysis data 112 to direct the generation of a proposed physical implementation of the dataflow description 106 or predict the performance of a proposed physical implementation. For example, the system 100 may be used to assist in the process of creating new programmable logic device architectures by estimating the performance of applications running on hypothetical platforms. In the case of a hypothetical platform, implementations tools (e.g., compilers, place and route tools) do not exist and are too expensive to develop as part of the process or exploring architectural alternatives. The analyzer 104 may be configured to generate sets of performance characteristics for individual execution units (e.g., actions) in the dataflow description 106. The post-analysis processor 150 may determine if the performance characteristics are consistent with aggregate performance goals for the complete system and then select proposed architectural elements capable of achieving the identified performance levels. Alternatively, the analyzer 104 may be configured to generate performance data for individual execution units in the dataflow description when such actions are mapped onto proposed architectural resources. These performance data can be used to predict the performance of the entire system. In either case, profiling information can be used to focus attention on those execution units of the dataflow description that have the most substantial impact on performance. Limiting the "search space" during architectural exploration is important, especially when some estimation must be done by hand for lack of automated tools for the proposed architecture.

Figure 4:
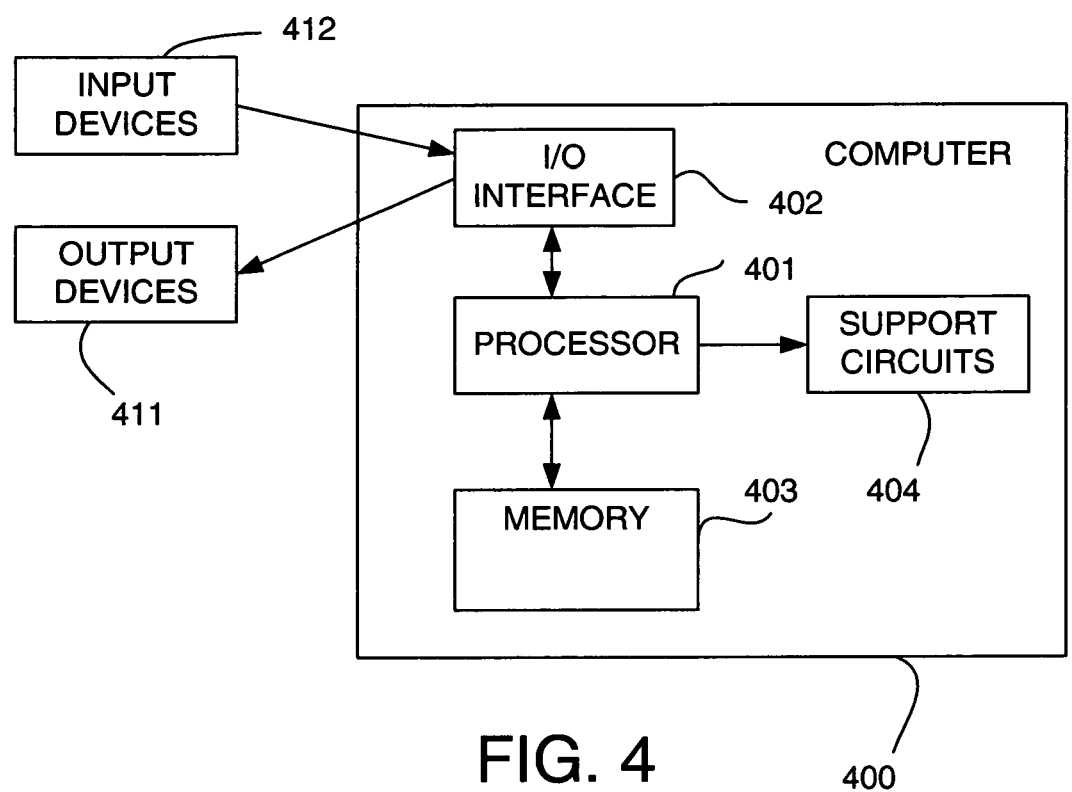
FIG. 4 is a block diagram depicting an exemplary embodiment of a computer suitable for implementing the processes and methods described herein.

FIG. 4 is a block diagram depicting an exemplary embodiment of a computer 400 suitable for implementing the processes and methods described herein. For example, the computer 400 may be used to implement the system 100 of FIG. 1 and the method 300 of FIG. 3. The computer 400 includes a processor 401, a memory 403, various support circuits 404, and an I/O interface 402. The processor 401 may be any type of microprocessor known in the art. The support circuits 404 for the processor 401 include conventional cache, power supplies, clock circuits, data registers, I/O interfaces, and the like. The I/O interface 402 may be directly coupled to the memory 403 or coupled through the processor 401. The I/O interface 402 may be coupled to various input devices 412 and output devices 411, such as a conventional keyboard, mouse, printer, display, and the like.

The memory 403 stores all or portions of one or more programs and/or data to implement the system 100 and method 300 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 400 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 403. The memory 403 may include one or more of the following random access memory, read only memory, magneto-resistive read/write memory, optical read/write memory, cache memory, magnetic read/write memory, and the like.

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of processing a dataflow description of a digital processing system implemented using an integrated circuit (IC), comprising:
   simulating, by a simulator executed on a computer, a model of the digital processing system as specified by the dataflow description given a set of inputs;
   identifying computational steps performed during the simulation; and
   generating causation trace data based on the computational steps, the causation trace data including at least one causation trace each of which is a record of dependencies among the computational steps for the set of inputs;
   wherein the dataflow description includes a network of actors, wherein at least one of the actors includes an interface having one or more ports, at least one of the actors includes state variables, at least one of the actors includes a state machine, and at least one of the actors includes one or more actions, each of the one or more actions configured to be fired to perform a function;
   wherein each port is an input port or an output port, and for communication from a first actor to a second actor in the network, the first actor outputs a token on an output port of the first actor and the second actor inputs the token on an input port of the second actor;
   wherein each of the computational steps comprises a firing of an action in the dataflow description;
   wherein at least one of the dependencies includes a dependency between a pair of actions in an actor of the network accessing a common state variable, at least one of the dependencies includes a dependency between a pair of actions in an actor of the network related by a state machine in the actor, at least one of the dependencies includes a dependency between a pair of actions in an actor of the network accessing a common port of the actor, and at least one of the dependencies includes a dependency between a pair of actions in the dataflow description related by a common token.

2. The method of claim 1, wherein each of the at least one causation traces includes a plurality of step elements, each of the step elements including at least one dependency element.

3. The method of claim 1, further comprising:
   processing the causation trace data using at least one analysis to produce analysis data.

4. The method of claim 3, wherein the at least one analysis includes a statistical analysis configured to count occurrences of elements in the at least one causation trace in the causation trace data.

5. The method of claim 3, wherein the at least one analysis includes a structural analysis configured to measure structural properties of the causation trace data.

6. The method of claim 3, wherein the at least one analysis includes a postmortem scheduling analysis for computing a schedule for the causation trace data with respect to use of hardware resources.

7. The method of claim 3, wherein the dataflow description includes execution units and the analysis data includes performance data for execution units, the method further comprising:
selecting architectural elements of a proposed physical implementation of the dataflow description, the architectural elements being configured to physically implement the execution units in accordance with the performance characteristics.

8. The method of claim 3, wherein the dataflow description includes execution units and the analysis data includes performance data for the execution units as mapped onto proposed architectural resources, the method further comprising:
predicting performance of the dataflow description using the performance data.

9. The method of claim 3, further comprising:
generating data for controlling physical implementation of the dataflow description for a target device using the analysis data.

10. Apparatus for processing a dataflow description of a digital processing system that is implemented using an integrated circuit (IC), comprising:
a means for simulating a model of the digital processing system as specified by the dataflow description given a set of inputs; and
a means for identifying computational steps performed during the simulation, and generating causation trace data based on the computational steps, the causation trace data including at least one causation trace each of which is a record of dependencies among the computation steps for the set of inputs;
wherein the dataflow description includes a network of actors, wherein at least one of the actors includes an interface having one or more ports, at least one of the actors includes state variables, at least one of the actors includes a state machine, and at least one of the actors includes one or more actions, each of the one or more actions configured to be fired to perform a function;
wherein each port is an input port or an output port, and for communication from a first actor to a second actor in the network, the first actor outputs a token on an output port of the first actor and the second actor inputs the token on an input port of the second actor;
wherein each of the computational steps comprises a firing of an action in the dataflow description;
wherein at least one of the dependencies includes a dependency between a pair of actions in an actor of the network accessing a common state variable, at least one of the dependencies includes a dependency between a pair of actions in an actor of the network related by a state machine in the actor, at least one of the dependencies includes a dependency between a pair of actions in an actor of the network accessing a common port of the actor, and at least one of the dependencies includes a dependency between a pair of actions in the dataflow description related by a common token.

11. The apparatus of claim 10, further comprising:
a means for processing the causation trace data using at least one analysis.

12. A computer readable medium having stored thereon instructions that, when executed by a processor cause the processor to perform a method of processing a dataflow description of a digital processing system that is implemented using an integrated circuit (IC), comprising:
simulating a model of the digital processing system as specified by the dataflow description given a set of inputs;
identifying computational steps performed during the simulation; and
generating causation trace data based on the computational steps, the causation trace data including at least one causation trace each of which is a record of dependencies among the computational steps for the set of inputs;
wherein the dataflow description includes a network of actors, wherein at least one of the actors includes an interface having one or more ports, at least one of the actors includes state variables, at least one of the actors includes a state machine, and at least one of the actors includes one or more actions, each of the one or more actions configured to be fired to perform a function;
wherein each port is an input port or an output port, and for communication from a first actor to a second actor in the network, the first actor outputs a token on an output port of the first actor and the second actor inputs the token on an input port of the second actor;
wherein each of the computational steps comprises a firing of an action in the dataflow description;
wherein at least one of the dependencies includes a dependency between a pair of actions in an actor of the network accessing a common state variable, at least one of the dependencies includes a dependency between a pair of actions in an actor of the network related by a state machine in the actor, at least one of the dependencies includes a dependency between a pair of actions in an actor of the network accessing a common port of the actor, and at least one of the dependencies includes a dependency between a pair of actions in the dataflow description related by a common token.

13. The computer readable medium of claim 12, further comprising:
processing the causation trace data using at least one analysis.

* * * * *